US011469253B2

United States Patent
Cao et al.

(10) Patent No.: US 11,469,253 B2
(45) Date of Patent: Oct. 11, 2022

(54) MANUFACTURING METHOD OF ARRAY SUBSTRATE USING DRY ETCHING PROCESSING AND WET ETCHING PROCESSING, ARRAY SUBSTRATE AND DISPLAY DEVICE

(71) Applicants: Beijing BOE Technology Development Co., Ltd., Beijing (CN); Hefei Xinsheng Optoelectronics Technology Co., Ltd., Anhui (CN)

(72) Inventors: Binbin Cao, Beijing (CN); Haijiao Qian, Beijing (CN); Chengshao Yang, Beijing (CN); Yinhu Huang, Beijing (CN)

(73) Assignees: Beijing BOE Technology Development Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 822 days.

(21) Appl. No.: 16/074,976

(22) PCT Filed: Nov. 14, 2017

(86) PCT No.: PCT/CN2017/110874
§ 371 (c)(1),
(2) Date: Aug. 2, 2018

(87) PCT Pub. No.: WO2018/218880
PCT Pub. Date: Dec. 6, 2018

(65) Prior Publication Data
US 2021/0202537 A1 Jul. 1, 2021

(30) Foreign Application Priority Data
May 27, 2017 (CN) .......................... 201710392393.9

(51) Int. Cl.
*H01L 27/12* (2006.01)

(52) U.S. Cl.
CPC ........ *H01L 27/1222* (2013.01); *H01L 27/127* (2013.01); *H01L 27/1288* (2013.01)

(58) Field of Classification Search
CPC ............... H01L 27/1222; H01L 27/127; H01L 27/1288; H01L 27/1214; H01L 27/1259; H01L 27/3248
(Continued)

(56) References Cited

U.S. PATENT DOCUMENTS 7,981,720 B2 7/2011 Kim et al.
2010/0025677 A1* 2/2010 Yamazaki ........... H01L 27/1225
204/192.1
(Continued)

FOREIGN PATENT DOCUMENTS

CN 102646633 A 8/2012
CN 101908489 B 6/2013
(Continued)

OTHER PUBLICATIONS

Mar. 2, 2018—(WO) International Search Report and Written Opinion Appn PCT/CN2017/110874 with English Translation.

*Primary Examiner* — Duy T Nguyen
(74) *Attorney, Agent, or Firm* — Banner & Witcoff, Ltd.

(57) ABSTRACT

A manufacturing method of an array substrate, an array substrate and a display device are disclosed. The manufacturing method of the array substrate includes: providing a base substrate (200); forming a semiconductor layer on the base substrate; depositing an etch stop layer material on the semiconductor layer; subjecting the etch stop layer material to a wet etching process to form an etch stop layer; subjecting the semiconductor layer to a dry etching process to form an active layer, wherein the active layer includes a first region and a second region surrounding the first region, an orthographic projection of the etch stop layer on the base substrate completely coincides with an orthographic projec-
(Continued)

tion of the first region of the active layer on the base substrate.

10 Claims, 2 Drawing Sheets

(58) Field of Classification Search
USPC .......................................................... 438/478
See application file for complete search history.

(56) References Cited

U.S. PATENT DOCUMENTS

| | | | | |
|---|---|---|---|---|
| 2011/0049524 | A1* | 3/2011 | Toyota | ............... G02F 1/136213 257/72 |
| 2013/0075731 | A1* | 3/2013 | Han | .................. H01L 29/66765 257/57 |
| 2013/0234134 | A1* | 9/2013 | Inoue | .................. H01L 29/7869 257/43 |
| 2014/0021499 | A1* | 1/2014 | Jang | ..................... H01L 27/3244 257/98 |
| 2014/0027760 | A1* | 1/2014 | Chang | ............... H01L 29/66742 257/43 |
| 2014/0077203 | A1* | 3/2014 | Yuan | .................. H01L 29/66969 257/43 |
| 2014/0138673 | A1* | 5/2014 | Shieh | ................ H01L 29/78696 257/43 |
| 2015/0126006 | A1 | 5/2015 | Chung et al. | |
| 2015/0311224 | A1* | 10/2015 | Zhang | ................. H01L 27/1262 257/72 |
| 2015/0333182 | A1* | 11/2015 | Guo | ..................... H01L 27/1288 257/43 |
| 2017/0162611 | A1* | 6/2017 | Cao | ......................... H01L 29/45 |
| 2018/0219105 | A1 | 8/2018 | Wang et al. | |

FOREIGN PATENT DOCUMENTS

| | | |
|---|---|---|
| CN | 105118864 A | 12/2015 |
| CN | 105679707 A | 6/2016 |
| CN | 107195659 A | 9/2017 |

* cited by examiner

MANUFACTURING METHOD OF ARRAY SUBSTRATE USING DRY ETCHING PROCESSING AND WET ETCHING PROCESSING, ARRAY SUBSTRATE AND DISPLAY DEVICE

The application is a U.S. National Phase Entry of International Application No. PCT/CN2017/110874 filed on Nov. 14, 2017, designating the United States of America and claiming priority to Chinese Patent Application No. 201710392393.9, filed on May 27, 2017. The present application claims priority to and the benefit of the above-identified applications and the above-identified applications are incorporated by reference herein in their entirety.

TECHNICAL FIELD

At least one embodiment of the present disclosure relates to a manufacturing method of an array substrate, an array substrate, and a display device.

BACKGROUND

Compared with amorphous silicon, low temperature poly-silicon (LTPS) has higher electron mobility and stability. Electron mobility of low temperature poly-silicon can reach tens or even hundreds of times of that of amorphous silicon. Therefore, technology for forming thin-film transistors using low-temperature polysilicon materials has been rapidly developed. A new generation of liquid crystal display (LCD) or organic light-emitting diode (OLED) derived from low-temperature poly-silicon has become an important display technology, in which the organic electroluminescent display device having characteristics such as ultra-thin, low power consumption, self-illumination, etc., are highly favored by users. The top-gate structure used in the LTPS technology has the disadvantages of complicated process and difficult control of costs. Therefore, a bottom-gate low-temperature poly-silicon thin-film transistor that can be completed only by 4-6 step masking processes has a great cost advantage. In order to control the magnitude of the leakage current, a bottom-gate type low-temperature poly-silicon thin film transistor generally employs a structure with an etch stop layer (ESL). The use of an etch stop layer in the ESL type thin film transistor can avoid back channel damage and can also reduce channel leakage current.

SUMMARY

At least one embodiment of the present disclosure provides a manufacturing method of an array substrate, comprising: providing a base substrate; forming a semiconductor layer on the base substrate; depositing an etch stop layer material on the semiconductor layer; subjecting the etch stop layer material to a wet etching process to form an etch stop layer; and subjecting the semiconductor layer to a dry etching process to form an active layer, wherein, the active layer comprises a first region and a second region surrounding the first region, and an orthographic projection of the etch stop layer on the base substrate completely coincides with an orthographic projection of the first region of the active layer on the base substrate.

For example, in an embodiment of the present disclosure, the forming the etch stop layer comprises: forming a mask pattern on the etch stop layer material; and etching the etch stop layer material uncovered by the mask pattern and located on the second region of the active layer with the mask pattern as a mask so as to form the etch stop layer located on the first region of the active layer.

For example, in an embodiment of the present disclosure, forming the active layer comprises: etching the etch stop layer material with the mask pattern as a mask.

For example, in an embodiment of the present disclosure, along a direction parallel with the base substrate, a minimum distance of an edge of the etch stop layer and an edge of the active layer is in a range of 0.5-1.5 µm.

For example, in an embodiment of the present disclosure, the method further comprises: forming a source electrode and a drain electrode on the etch stop layer, wherein, each of the source electrode and the drain electrode is in contact with a portion of the second region of the active layer.

For example, in an embodiment of the present disclosure, an etch selectivity ratio of the etch stop layer material to the semiconductor layer of an etching liquid used in the wet etching process is greater than 1000:1.

For example, in an embodiment of the present disclosure, a material of the etch stop layer comprises at least one selected from the group consisting of an oxide of silicon, a nitride of silicon and combination thereof.

For example, in an embodiment of the present disclosure, the semiconductor layer is a poly-silicon layer, and forming the semiconductor layer on the base substrate comprises: depositing an amorphous silicon layer on the base substrate, and crystallizing the amorphous silicon layer to form the poly-silicon layer by a laser annealing process.

At least one embodiment of the present disclosure provides an array substrate, comprising: a base substrate, an active layer located on the base substrate, an etch stop layer located on a side of the active layer away from the base substrate, wherein, the active layer comprises a first region and a second region surrounding the first region, and an orthographic projection of the etch stop layer on the base substrate completely coincide with an orthographic projection of the first region of the active layer on the base substrate.

For example, in an embodiment of the present disclosure, along a direction parallel with the base substrate, a minimum distance of an edge of the etch stop layer and an edge of the active layer is in a range of 0.5-1.5 µm.

For example, in an embodiment of the present disclosure, the array substrate further comprises a source electrode and a drain electrode, wherein each of the source electrode and the drain electrode is in contact with a portion of the etch stop layer and a portion of the second region of the active layer.

For example, in an embodiment of the present disclosure, a material of the etch stop layer comprises at least one selected from the group consisting of an oxide of silicon, a nitride of silicon and combination thereof.

For example, in an embodiment of the present disclosure, a material of the active layer comprises poly-silicon.

At least one embodiment of the present disclosure provides a display device comprising any one of the array substrates according to embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

In the research, the inventors of the present application found that, at present, in an array substrate using an etch stop layer type bottom-gate low-temperature poly-silicon thin film transistor, the same mask is used for simultaneously dry etching the etch stop layer and the active layer. The etch selectivity ratio of the etch stop layer to the active layer is relatively equal, so the etch stop layer and the active layer is basically the same in pattern size. The etch selectivity ratio is a ratio of etch rates for different materials or layers. Here, the etch stop layer and the active layer have relatively equal etch selectivity ratio. Therefore, the size of the pattern formed after being etched is basically the same.

Figure 1:
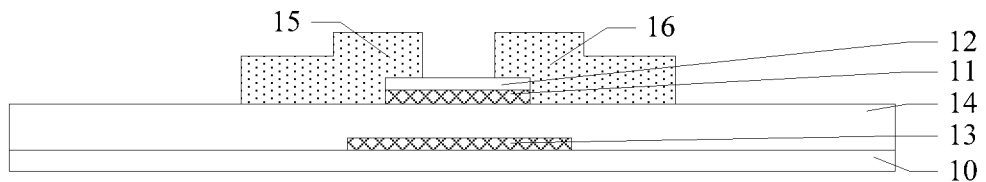
FIG. 1 is a schematic view of a part of an array substrate generally adopting a low-temperature poly-silicon thin film transistor.

FIG. 1 is a schematic view illustrating a part of a general array substrate using a low-temperature poly-silicon thin film transistor. As illustrated in FIG. 1, the array substrate includes a base substrate 10, a gate electrode 13 located on the base substrate 10, a gate insulation layer 14 covering the gate electrode 13, and an active layer 11 and an etch stop layer 12 which are located on the gate insulation layer 14.

On the one hand, because the etch stop layer 12 and the active layer 11 are dry-etched synchronously, an orthographic projection of the active layer 11 on the base substrate 10 and an orthographic projection of the etch stop layer 12 on the base substrate 10 are basically completely coincident, so the etch stop layer 12 almost completely covers the active layer 11, resulting in a source electrode 15 and a drain electrode 16 being only in contact with sidewall of the active layer 11, so that electrons can only be transported by passing through the sidewall of the active layer 11. That is, the electrons of the source electrode 15 can only be transported to the drain electrode 16 by passing through the sidewall of the active layer 11. In general, the active layer has a film thickness of only 50 nm, and a contact area between the sidewall of the active layer and the source/drain electrodes is small. Therefore, the improvement of the on-state current (Ion) is greatly limited, and it is difficult to exploit the advantages of high electron mobility of poly-silicon.

On the other hand, the active layer 11 and the etch stop layer 12 are simultaneously etched, and the etching thickness is large, resulting in a large total etching amount, which may easily lead to over-etching of the gate n 14, and therefore, defects such as a short circuit between a data line and a gate line on both sides of the gate insulation layer or a short circuit between a data line and a common electrode line on both sides of the gate insulation layer can easily occur.

The embodiments of the present disclosure provide a manufacturing method of an array substrate, an array substrate, and a display device. The manufacturing method of the array substrate includes: providing a base substrate, forming a semiconductor layer on the base substrate, depositing an etch stop layer material on the semiconductor layer, and subjecting the etch stop layer material to a wet etching process to form an etch stop layer, subjecting the semiconductor layer to a dry etching process to form an active layer, wherein the active layer includes a first region and a second region surrounding the first region, and an orthographic projection of the etch stop layer on the base substrate completely coincide with an orthographic projection of the first region of the active layer on the base substrate. With the manufacturing method of the array substrate provided by the embodiments of the present disclosure, on the one hand, the contact area between the source/drain electrode and the active layer in the thin film transistor can be increased, thereby increasing the on-state current and the electron mobility, and on the other hand, the over-etching of the gate insulation layer can be reduced, a short circuit between the data line and the gate electrode line on both sides of the gate insulation layer or a short circuit between the data line and a common electrode line on both sides of the gate insulation layer can be avoided, thereby improving the yield rate of the product.

A manufacturing method of an array substrate, an array substrate, and a display device provided by embodiments of the present disclosure will be described below with reference to the accompanying drawings.

Figure 2:
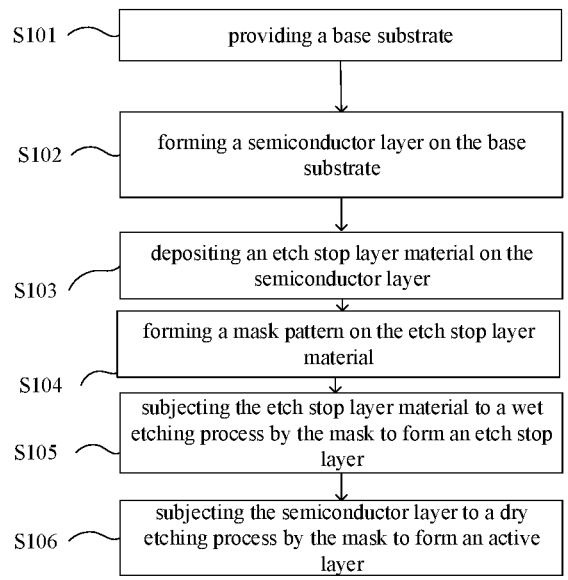
FIG. 2 is a schematic diagram of specific steps of a manufacturing method of an array substrate provided by an embodiment of the present disclosure.

An embodiment of the present disclosure provides a manufacturing method of an array substrate, FIG. 2 is a schematic diagram of specific steps of a manufacturing method of an array substrate provided by this embodiment, and FIGS. 3a to 3g are schematic views of a manufacturing process of the array substrate provided by this embodiment. As illustrated in FIG. 2 and FIGS. 3a-3g, the manufacturing method can include the following steps.

S101: providing a base substrate.

For example, a material of the base substrate 200 can include one or more materials selected from the group consisting of glass, polyimide, polycarbonate, polyacrylate, polyetherimide, and polyether sulfone. This embodiment includes but is not limited thereto.

Figure 3A:
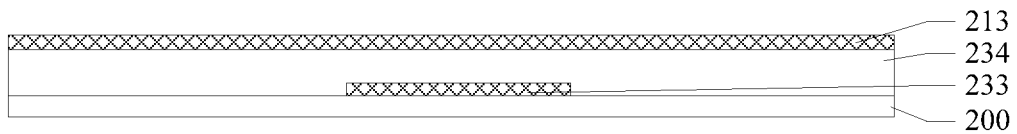
FIGS. 3a to 3g are schematic diagrams illustrating a manufacturing process of an array substrate provided by an embodiment of the present disclosure.

For example, the array substrate provided in this embodiment includes a thin film transistor of bottom-gate type. As illustrated in FIG. 3a, a material for forming a gate electrode is deposited on a base substrate 200, and is patterned to form a gate electrode 233.

For example, the gate electrode 233 can adopt any one of aluminum, copper, chromium, molybdenum, titanium, and other metal materials, or alloy thereof. This embodiment includes but is not limited thereto.

For example, a gate line and a common electrode line (not illustrated in FIG. 3a) can further be formed in the same layer of the gate electrode 233, and the present embodiment includes but is not limited thereto.

For example, as illustrated in FIG. 3a, a gate insulation layer 234 is covered the gate electrode 233. For example, the gate insulation layer 234 can be selected from materials such as oxide, nitride, or nitrogen oxide, and the present embodiment includes but is not limited thereto.

S102: forming a semiconductor layer on the base substrate.

For example, as illustrated in FIG. 3a, the semiconductor layer 213 is formed on the base substrate 200, that is, the semiconductor layer 213 is formed on the gate insulation layer 234. The semiconductor layer 213 formed in this embodiment is a poly-silicon layer. For example, forming the semiconductor layer 213 on the base substrate 200 includes: depositing an amorphous silicon layer on the base substrate 200 and crystallizing the amorphous silicon layer to form a poly-silicon layer by using an excimer laser annealing process. That is, the amorphous silicon layer deposited on the gate insulation layer 234 is crystallized by an excimer laser annealing process to form the poly-silicon layer. For example, a surface of the amorphous silicon is irradiated with a laser beam of different energy density, and the amorphous silicon is heated and melted, and the liquid amorphous silicon is crystallized upon being cooled.

For example, a method for crystallizing an amorphous silicon layer to form a poly-silicon layer can also be a metal induced crystallization process. For example, metal catalyst is used to reduce the nucleation temperature of amorphous silicon so as to achieve nucleation at a low temperature.

For example, the amorphous silicon layer can be crystallized by a selective laser sintering method, a continuous transverse curing process, or the like to form the poly-silicon layer, which is not limited in this embodiment.

S103: depositing an etch stop layer material on the semiconductor layer.

Figure 3B:
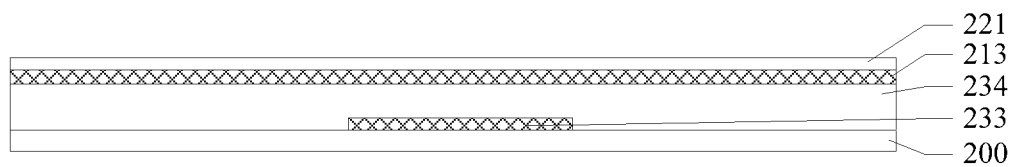

For example, as illustrated in FIG. 3b, an etch stop layer material 221 is deposited on the semiconductor layer 213. For example, the etch stop layer material 221 can include at least one selected from the group consisting of an oxide of silicon, a nitride of silicon and combination thereof. For example, the etch stop layer material 221 can include silicon dioxide or silicon nitride or the like. The present embodiment includes but is not limited thereto.

For example, a material selected for the gate insulation layer 234 in this embodiment can be the same as the material of the etch stop layer 221. This embodiment includes but is not limited thereto.

Figure 3C:
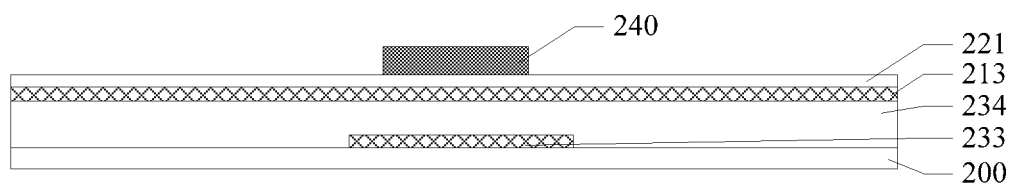

For example, a mask pattern 240 is formed on the etch stop layer material 221. For example, the mask pattern 240 formed on the etch stop layer material 221 can be a photoresist pattern. As illustrated in FIG. 3c, a thin, uniform and defect-free photoresist layer can be coated on the etch stop layer material 221 by a spin coating method. This embodiment is not limited thereto, and other coating methods can also be used.

For example, the photoresist can be composed of a resin, a photosensitizer, a solvent, and an additive. Before being exposed, the photoresist layer needs to be pre-baked, so that the solvent in the photoresist layer is evaporated, and the line resolution after being exposed is improved. For example, positive photoresist can be pre-baked in air, while negative photoresist needs to be pre-baked in a nitrogen atmosphere.

For example, the photoresist layer can be irradiated with an electron beam, an ion beam, an X-ray, an ultraviolet ray or the like to expose the photoresist layer, and the embodiment is not limited thereto.

For example, the photoresist layer can be developed with an alkaline developer such as sodium bicarbonate (1%), and the present embodiment is not limited thereto. The mask pattern 240 is formed after the photoresist layer is developed.

S104: subjecting the etch stop layer material to a wet etching process to form an etch stop layer.

Figure 3D:
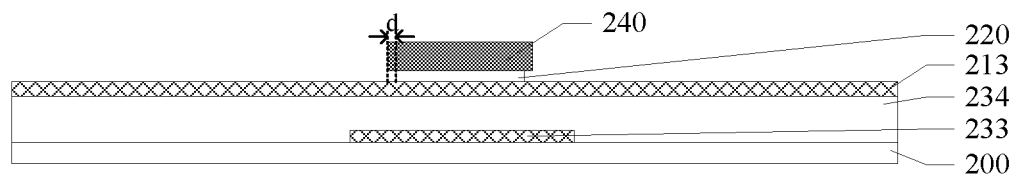

For example, as illustrated in FIG. 3d, the etch stop layer material 221 is wet etched with the mask pattern 240 as a mask to form the etch stop layer 220. In the wet etching process, at a surface of an etched object, an etching liquid reacts with the etched object, the etching liquid is continuously consumed, a reaction product is continuously generated, a concentration gradient is formed around the etched object, and a new etching liquid is promoted to be continuously transported to the etched object, and the reaction product is removed from the surface of the etched object, so that the new etching liquid is brought into contact the etched object. The "etched object" here refers to the etch stop layer material 221.

For example, the etching liquid adopted in the wet etching process has an etch selectivity ratio of the etch stop layer material 221 to the semiconductor layer 213 which is greater than 1000:1. This embodiment includes but is not limited thereto. For example, the etching liquid adopted in the wet etching process can include a hydrogen fluoride series such as a solution including hydrogen fluoride, and the present embodiment includes but is not limited thereto. In the embodiment, because the etching selectivity ratio of the etch stop layer material 221 to the semiconductor layer 213 during the etching of the etch stop layer material 221 using the hydrogen fluoride series etching liquid is greater than 1000:1, the semiconductor layer 213 is seldom etched by the etching liquid. That is, when the etch stop layer material 221 is etched by using a hydrogen fluoride-based etching liquid, the semiconductor layer 213 under the etch stop layer material 221 is minimally affected.

For example, during the wet etching process, the etch stop layer material 221 can be etched in a puddle mode or a dip mode at a relatively low etching rate, and in a direction parallel with the substrate 200, a distance of an bottom edge of the etch stop layer 220 and an edge of the mask pattern 240 can be effectively controlled by a measurement device. The present embodiment includes but is not limited thereto.

For example, an undercut can be formed below the edge of the mask pattern 240 during the wet etching process. That is, the edge of the etch stop layer 220 formed by the etching process is recessed inside the edge of the mask pattern 240. For example, the edge of the etch stop layer 220 formed by a patterned process is retracted by 0.5-1.5 μm with respect to the edge of the mask pattern 240. That is, in a direction parallel with the base substrate 200, a minimum distance d between the edge of the etch stop layer 220 illustrated in FIG. 3d and the edge of the mask pattern 240 is in a range of 0.5-1.5 μm.

S105: subjecting the semiconductor layer to a dry etching process to form an active layer.

Figure 3E:
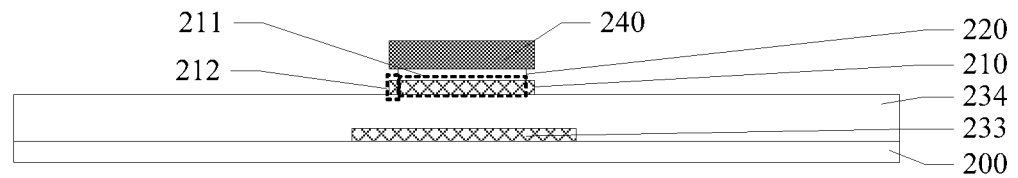

For example, as illustrated in FIG. 3e, the semiconductor layer 213 is further subjected to a dry etching process with the mask pattern 240 as a mask to form the active layer 210. The dry etching process is a process in which an object material is etched and removed by a chemical reaction or a physical reaction between the object material and an ion group or ion in plasma. Here, the "object material" refers to the semiconductor layer 213.

For example, the dry etching process adopted in this embodiment can be a plasma etching (PE) mode, a reactive ion etching (RIE) mode, or an inductively coupled plasma (ICP) mode. Limitations are not imposed in this embodiment.

For example, an etching gas adopted in the dry etching process can include carbon tetrafluoride/oxygen ($CF_4/O_2$), etc., and the embodiment is not limited thereto. The undercut is not easily formed by the dry etching process. Therefore, a pattern of the active layer 210 formed is substantially the same as the mask pattern 240. That is, an orthographic projection of the active layer 210 on the base substrate 200 substantially coincides with an orthographic projection of the mask pattern 240 on the base substrate 200.

For example, as illustrated in FIG. 3e, the active layer 210 formed by a patterning process includes a first region 211 and a second region 212 surrounding the first region 211. The etch stop layer 220 is located in the first region 211, i.e., the orthographic projection of the etch stop layer 220 on the base substrate 200 completely coincides with the orthographic projection of the first region 211 on the base substrate 200. Therefore, forming the etch stop layer 220 includes: etching the etch stop layer material 221 uncovered by the mask pattern 240 and on the second region 212 of the active layer 210 to form the etch stop layer 220 on the first region 211 of the active layer 210. In the present embodiment, the etch stop layer formed on the active layer can not only prevent damage of the back channel but also reduce the leakage current of the channel.

Figure 3F:
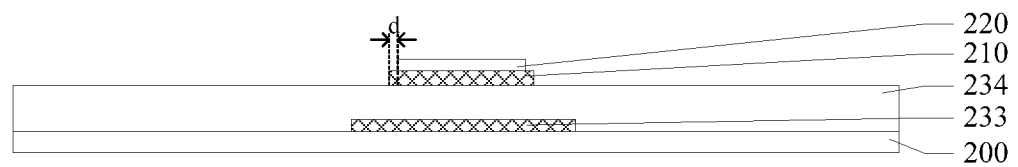

For example, as illustrated in FIG. 3f, the mask pattern 240 on the etch stop layer 220 is stripped off. Both the etch stop layer 220 and the active layer 210 are patterned with the same mask pattern 240, while the etch stop layer 220 is wet etched and the active layer 210 is dry etched, so that the etch stop layer 220 does not completely cover the active layer 210. For example, in the direction parallel with the base substrate 200, the minimum distance d between the edge of the etch stop layer 220 and the edge of the active layer 210 is in a range of 0.5-1.5 µm. In this embodiment, the mask patterning process can be not increased by using the same mask pattern 240 as a mask during the patterning for the etch stop layer 220 and the active layer 210.

Figure 3G:
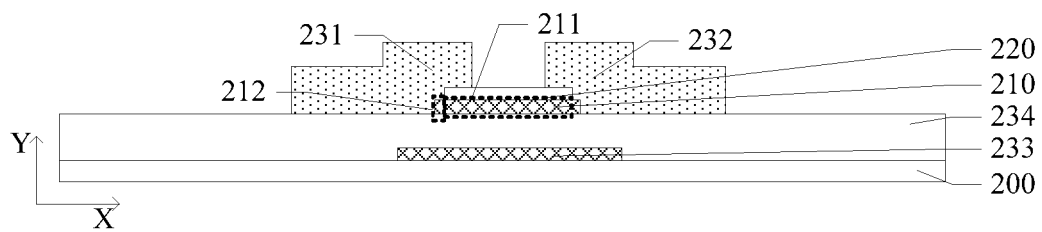

For example, as illustrated in FIG. 3g, a source electrode 231 and a drain electrode 232 are formed on the etch stop layer 220 by using a patterning process, and each of the source electrode 231 and the drain electrode 232 is in contact with a portion of the etch stop layer 220 and a portion of the second region 212 of the active layer 210. Therefore, electrons can be transported not only through the sidewall of the active layer 210 but also through the second region 212 of the active layer 210 that is in contact with the source electrode 231 and the drain electrode 232. That is, the current of the source electrode 231 can be transported toward the drain electrode 232 through the sidewall of the active layer 210 and the second region 212 of the active layer 210, thereby increasing the on-state current and the electron mobility.

For example, the source electrode 231 and the drain electrode 232 can be any one of metal materials such as aluminum, copper, chromium, molybdenum, titanium or the like and alloy thereof. This embodiment is not limited thereto.

For example, an ion-doped amorphous silicon layer ($n^+\alpha$-Si) or the like can be further included between the source electrode 231 (drain electrode 232) and the active layer 210 to improve ohmic contact between the source electrode 231 (drain electrode 232) and the active layer 210. This embodiment is not limited thereto. When the thin film transistor is turned on, the current of the source electrode 231 is transported through the drain electrode 232 to an anode of an organic light emitting diode or a pixel electrode of a liquid crystal display.

For example, a data line (not illustrated in the figure) can be formed in the same layer as the source electrode 231 and the drain electrode 232. That is, a data line can be formed on the gate insulation layer 234. Therefore, the gate insulation layer 234 can insulate the data line from the gate electrode line on both sides of the gate insulation layer 234 or can insulate the data line from the common electrode line on both sides of the gate insulation layer 234. This embodiment includes but is not limited thereto.

In the manufacturing method of the array substrate provided by this embodiment the same mask pattern is adopted to form an etch stop layer by a wet etching process and to form an active layer by a dry etching process, which can increase a contact area between the active layer and the source/drain electrodes, and increase the on-state current and electron mobility. On the other hand, because only the active layer needs to be formed by a dry etching process, the etching amount as a whole is reduced, so that etching of the gate insulation layer can be reduced, and a short circuit between the data line and the gate electrode line on both sides of the gate insulation layer or a short circuit between the data line and common electrode line on both sides of the gate insulation layer can be avoided, thereby improving the yield rate of the product.

Figure 4:
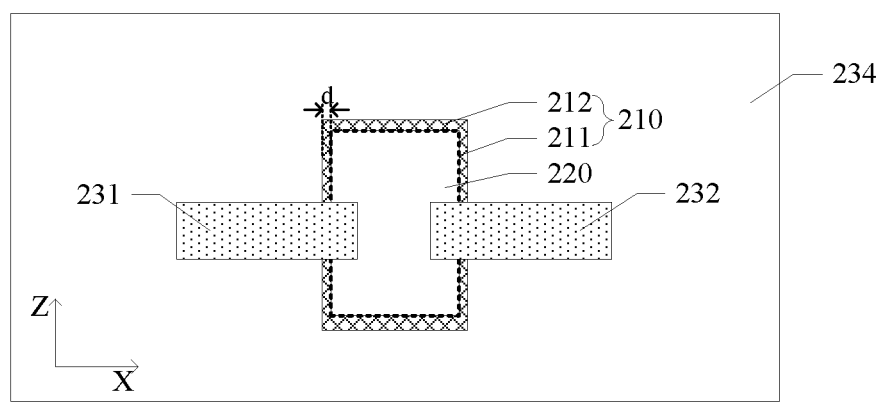
FIG. 4 is a plan view of the array substrate illustrated in FIG. 3g.

Another embodiment of the present disclosure provides an array substrate, FIG. 3g is a cross-sectional view illustrating a part of the array substrate provided in this embodiment, and FIG. 4 is a plan view of the array substrate illustrated in FIG. 3g. As illustrated in FIG. 3g, the array substrate includes a base substrate 200, an active layer 210 located on the base substrate 200, and an etch stop layer 220 on a side of the active layer 210 away from the base substrate 200. As illustrated in FIG. 4, the active layer 210 includes a first region 211 (a region surrounded by a dotted line in the figure) and a second region 212 surrounding the first region 211. The etch stop layer 220 is located in the first region 211. That is, an orthographic projection of the etching stop layer 220 on the base substrate 200 completely coincides with an orthographic projection of the first region 211 on the base substrate 200. In the present embodiment, the etch stop layer formed on the active layer can not only prevent the damage of the back channel but also reduce the leakage current of the channel.

For example, as illustrated in FIG. 4, the array substrate further includes a source electrode 231 and a drain electrode 232 on the etch stop layer 220. Each of the source electrode 231 and the drain electrode 232 is in contact with a portion of the etch stop layer 220 and a portion of second region 212 of the active layer 210, respectively. Compared with the case that the orthographic projection of the etch stop layer on the base substrate substantially coincides with the orthographic projection of the active layer on the base substrate, resulting in that the source electrode and drain electrode only contact the sidewall of the active layer, and the electrons can only be transported through the sidewall of the active layer, the contact area between the source/drain electrode and the active layer is increased in this embodiment, therefore, the electrons can not only be transported through the sidewall of the active layer, but also can be transported through the second region of the active layer which is in contact with the source electrode and the drain electrode. That is, the current of the source electrode can be transported through the sidewall of the active layer and the second region of the active layer to the drain electrode, thereby increasing the on-state current and electron mobility.

For example, as illustrated in FIG. 3g, the array substrate further includes a gate electrode 233 located on the base substrate 200 and a gate insulation layer 234 covered the gate electrode 233.

For example, a gate line and a common electrode line (not illustrated in the figure) can be provided in the same layer of the gate electrode 233, and a data line (not illustrated in the figure) can be provided in the same layer of the source electrode 231 and the drain electrode 232. The gate insulation layer 234 is used to insulate the gate line and the common electrode line and the data line on both sides of the gate insulation layer 234 from each other. This embodiment includes but is not limited thereto.

For example, a material of the base substrate 200 can include one or more materials selected from the group consisting of glass, polyimide, polycarbonate, polyacrylate, polyetherimide, and polyether sulfone. This embodiment includes but is not limited thereto.

For example, the gate electrode 233 can use any one of metal materials of aluminum, copper, chromium, molybdenum, titanium or the like, and alloy thereof. This embodiment includes but is not limited thereto.

For example, the gate insulation layer 234 can be selected from materials such as oxide, nitride, nitrogen oxide and combination thereof, and the present embodiment includes but is not limited thereto.

For example, a material of the etch stop layer 220 includes at least one selected from the group consisting of an oxide of silicon, a nitride of silicon and combination thereof, and the present embodiment includes but is not limited thereto.

For example, a material selected for the gate insulation layer 234 can be the same as the material of the etch stop layer 220, and this embodiment includes but is not limited thereto.

For example, a material of the active layer 210 includes poly-silicon, and the present embodiment includes but is not limited thereto. For example, the poly-silicon active layer 210 in this embodiment can be formed by crystallization of amorphous silicon.

For example, as illustrated in FIGS. 3g and 4, in a direction parallel with the base substrate 200, a minimum distance d between an edge of the etch stop layer 220 and an edge of the active layer 210 is in a range of 0.5-1.5 µm, i.e., a minimum distance d between an edge of the etch stop layer 220 and an edge of the active layer 210 in an X direction is in a range of 0.5-1.5 µm. That is, an edge of the second region 212 extending in a Z direction has a dimension d in the range of 0.5-1.5 µm along the X direction. This embodiment includes but is not limited thereto. For example, the edge of the second region 212 extending along the X direction has a dimension in the range of 0.5-1.5 µm along the Z direction. This embodiment includes but is not limited thereto.

According to the array substrate provided in this embodiment, by reducing the covering area of the etch stop layer on the active layer, the contact area between the active layer and the source/drain electrode can be increased, thereby increasing the on-state current and the electron mobility. In addition, the array substrate provided by this embodiment reduces the over-etching of the gate insulation layer during the manufacturing process, thereby avoiding a short circuit between the data line and the gate line on both sides of the gate insulation layer or a short circuit between the data line and the common electrode line on both sides of the gate insulation layer, thereby improving the yield rate of the product.

Another embodiment of the present disclosure provides a display device including any one of the array substrates provided by the above embodiments. The display device can increase a contact area between the active layer and the source/drain electrode by reducing the covering area of the etch stop layer on the active layer, thereby increasing the on-state current and the electron mobility. In addition, the display device can also avoid a short circuit between the data line and the gate line on both sides of the gate insulation layer or a short circuit between the data line and the common electrode line on both sides of the gate insulation layer, thereby improving the yield rate of the product.

For example, the display device can be a display device such as a liquid crystal display device, an organic electroluminescent display device, or the like, or any product or component having a display function such as a television, a digital camera, a mobile phone, a watch, a tablet computer, a notebook computer, a navigator including the display device, this embodiment is not limited thereto.

With respect to the present disclosure, the following statements should be noted.

(1) The same reference numerals refer to the same elements/components unless otherwise defined.

(2) Only the structures involved in the embodiments of the present disclosure are involved in the embodiments and drawings of the present disclosure, other structures can refer to usual designs.

(3) In order to clearly illustrate, a layer or an area may be amplified in the drawings of the embodiments of the present disclosure. It is to be understood that, when a member such as a layer, a film, an area or a substrate is located or disposed on or below another member, the member can be located or disposed on or below the another member directly, or an intermediate member or intermediate member(s) can be disposed.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A manufacturing method of an array substrate, comprising:
   providing a base substrate;
   forming a semiconductor layer on the base substrate;
   depositing an etch stop layer material on the semiconductor layer;
   forming an etch stop layer by subjecting the etch stop layer material to a wet etching process; and
   after the forming the etch stop layer, forming an active layer by subjecting the semiconductor layer to a dry etching process,
   wherein the active layer comprises a first region and a second region surrounding the first region, and an orthographic projection of the etch stop layer on the base substrate completely coincides with an orthographic projection of the first region of the active layer on the base substrate,
wherein the forming the etch stop layer comprises:
    forming a mask pattern on the etch stop layer material; and
    etching etch stop layer material uncovered by the mask pattern and located on the second region of the active layer with the mask pattern as a mask so as to form the etch stop layer, wherein the etch stop layer is located on the first region of the active layer,
wherein the forming the active layer comprises:
    etching the semiconductor layer with the mask pattern as the mask.

2. The manufacturing method of the array substrate according to claim 1, wherein, along a direction parallel with the base substrate, a minimum distance between an edge of the etch stop layer and an edge of the active layer is in a range of 0.5-1.5 µm.

3. The manufacturing method of the array substrate according to claim 1, further comprising:
    forming a source electrode and a drain electrode on the etch stop layer,
    wherein, each of the source electrode and the drain electrode is in contact with a portion of the second region of the active layer.

4. The manufacturing method of the array substrate according to claim 1, wherein an etching liquid used in the wet etching process has an etch selectivity ratio of the etch stop layer material to the semiconductor layer which is greater than 1000:1.

5. The manufacturing method of the array substrate according to claim 1, wherein a material of the etch stop layer comprises at least one selected from the group consisting of an oxide of silicon, a nitride of silicon, and a combination thereof.

6. The manufacturing method of the array substrate according to claim 1, wherein the semiconductor layer is a poly-silicon layer, and the forming the semiconductor layer on the base substrate comprises:
    depositing an amorphous silicon layer on the base substrate, and crystallizing, by a laser annealing process, the amorphous silicon layer to form the poly-silicon layer.

7. A manufacturing method of an array substrate, comprising:
    providing a base substrate;
    forming a semiconductor layer on the base substrate;
    depositing an etch stop layer material on the semiconductor layer;
    forming an etch stop layer by subjecting the etch stop layer material to a wet etching process; and
    after the forming the etch stop layer, forming an active layer by subjecting the semiconductor layer to a dry etching process,
wherein the active layer comprises a first region and a second region surrounding the first region, and an orthographic projection of the etch stop layer on the base substrate completely coincides with an orthographic projection of the first region of the active layer on the base substrate,
the forming the etch stop layer comprises:
    forming a mask pattern on the etch stop layer material; and
    etching etch stop layer material uncovered by the mask pattern and located on the second region of the active layer with the mask pattern as a mask so as to form the etch stop layer, wherein the etch stop layer is located on the first region of the active layer,
the forming the active layer comprises: etching the semiconductor layer with the mask pattern as a mask,
wherein, along a direction parallel with the base substrate, a minimum distance between an edge of the etch stop layer and an edge of the active layer is in a range of 0.5-1.5 µm,
wherein an etching liquid used in the wet etching process has an etch selectivity ratio of the etch stop layer material to the semiconductor layer which is greater than 1000:1.

8. The manufacturing method of the array substrate according to claim 7, further comprising:
    forming a source electrode and a drain electrode on the etch stop layer,
    wherein each of the source electrode and the drain electrode is in contact with a portion of the second region of the active layer.

9. The manufacturing method of the array substrate according to claim 7, wherein a material of the etch stop layer comprises at least one selected from the group consisting of an oxide of silicon, a nitride of silicon, and a combination thereof.

10. The manufacturing method of the array substrate according to claim 7, wherein the semiconductor layer is a poly-silicon layer, and the forming the semiconductor layer on the base substrate comprises:
    depositing an amorphous silicon layer on the base substrate, and crystallizing, by a laser annealing process, the amorphous silicon layer to form the poly-silicon layer.

* * * * *